(12) United States Patent
Shin

(10) Patent No.: US 8,483,983 B2
(45) Date of Patent: Jul. 9, 2013

(54) INFORMATION PROCESSING APPARATUS AND BATTERY DEGRADATION DETECTION METHOD

(75) Inventor: Lam Thow Shin, Gateway East (SG)

(73) Assignee: Kabushiki Kaisha Toshiba, Tokyo (JP)

( * ) Notice: Subject to any disclaimer, the term of this patent is extended or adjusted under 35 U.S.C. 154(b) by 487 days.

(21) Appl. No.: 12/816,339

(22) Filed: Jun. 15, 2010

(65) Prior Publication Data

US 2010/0332166 A1 Dec. 30, 2010

(30) Foreign Application Priority Data

Jun. 26, 2009 (JP) ................................. 2009-152355

(51) Int. Cl.
*G01R 31/36* (2006.01)
(52) U.S. Cl.
USPC ............................................................ 702/63
(58) Field of Classification Search
USPC .............................. 702/63; 324/425; 320/132
See application file for complete search history.

(56) References Cited

U.S. PATENT DOCUMENTS

| 5,187,424 A | * | 2/1993 | Benz et al. ..................... 320/132 |
| 6,114,836 A | * | 9/2000 | Hagiwara et al. ............. 320/132 |
| 6,690,171 B2 | * | 2/2004 | Chen .............................. 324/425 |

FOREIGN PATENT DOCUMENTS

| JP | H03-223684 A2 | 10/1991 |
| JP | 10-134847 | 5/1998 |
| JP | H10-134847 A | 5/1998 |
| JP | 10-295046 | 11/1998 |
| JP | H10-295046 A | 11/1998 |
| JP | 2003-009405 A | 1/2003 |
| JP | 2004-271342 A | 9/2004 |
| JP | 2008-277136 A | 11/2008 |

OTHER PUBLICATIONS

Notice of Reasons for Rejection mailed by Japan Patent Office on Jul. 5, 2011 in the corresponding Japanese patent application No. 2009-152355 in 8 pages.
Information Sheet for preparing an Information Disclosure Statement under Rule 1.56.

* cited by examiner

*Primary Examiner* — Jonathan C Teixeira Moffat
*Assistant Examiner* — Xiuquin Sun
(74) *Attorney, Agent, or Firm* — Knobbe, Martens, Olson & Bear LLP

(57) ABSTRACT

According to one embodiment, an information processing apparatus is configured to be powered by a battery. The apparatus includes a charging circuit, a charging current measuring module, a charging time measuring module, and a calculation module. The charging circuit charges the battery by using power from an external power supply. The charging current measuring module measures a charging current supplied to the battery from the charging circuit. The charging time measuring module measures a time during which the battery is charged by the charging current. The calculation module calculates a charging capacity from the measured charging current and the measured charging time, and compares an accumulated charging capacity, which is obtained by cumulatively adding the calculated charging capacity to a previously calculated charging capacity, with a reference value, in order to detect degradation of the battery.

7 Claims, 4 Drawing Sheets

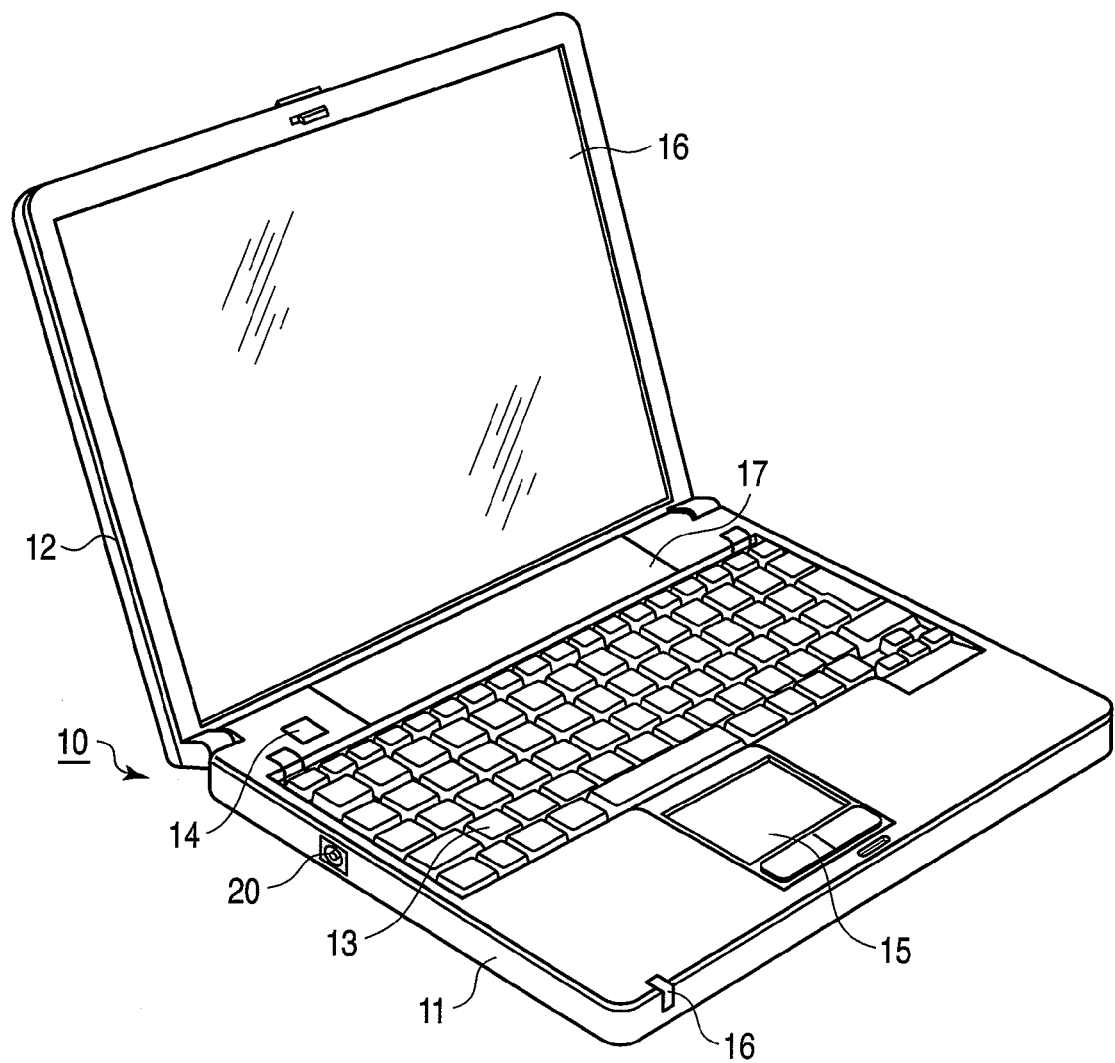
F I G. 1

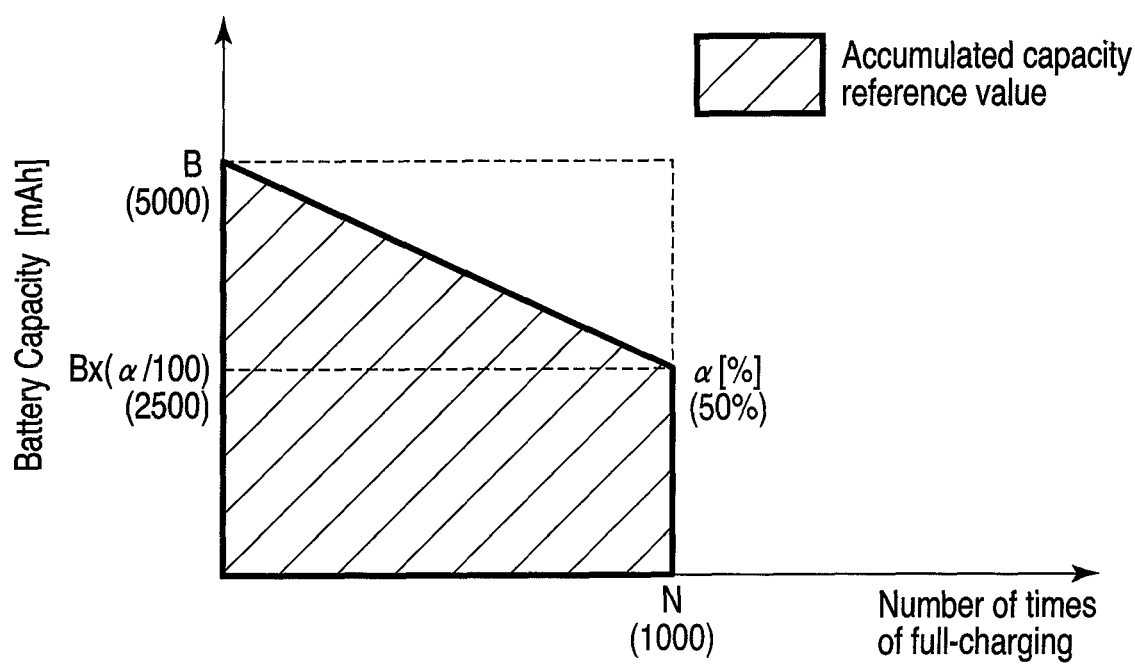
F I G. 5

INFORMATION PROCESSING APPARATUS AND BATTERY DEGRADATION DETECTION METHOD

CROSS-REFERENCE TO RELATED APPLICATIONS

This application is based upon and claims the benefit of priority from Japanese Patent Application No. 2009-152355, filed Jun. 26, 2009; the entire contents of which are incorporated herein by reference.

FIELD

Embodiments described herein relate generally to an information processing apparatus such as a personal computer, and a battery degradation detection method which is applied to this apparatus.

BACKGROUND

In recent years, various kinds of notebook-type or laptop-type portable personal computers have been developed. Most of such personal computers are configured to be battery-powerable. The chargeable capacity of a battery decreases each time the battery is charged. As the number of times of charging of the battery increases, the chargeable capacity of the battery becomes smaller.

In usual cases, "one-time charging" is counted when the battery capacity has varied from a certain lower limit value to an upper limit value at a time by charging. When charging is performed such that the battery capacity has varied within the range between the lower limit value and the upper limit value, "one-time charging" is not counted. Thus, the count value of the number of times of charging is smaller than the value corresponding to the actual charging capacity. Consequently, such a situation would occur that even if the count value of the number of times of charging is less than a certain reference value, the actual chargeable capacity of the battery has considerably decreased.

Jpn. Pat. Appln. KOKAI Publication No. H10-295046 discloses an apparatus of detecting the degradation of a rechargeable battery. This apparatus detects degradation of the rechargeable battery by making use of such characteristics that the charge current tends to increase when the rechargeable battery has degraded. Specifically, this apparatus detects degradation of the rechargeable battery when the charge current of the rechargeable battery is above a threshold value for a predetermined time or more.

However, the charging current that is supplied to the battery may vary due to factors other than degradation of the battery. For example, in an information processing apparatus such as a computer, the charging current that is supplied to the battery may possibly vary due to the load of the information processing apparatus. For example, when the load of the information processing apparatus is large, the charging current that is supplied to the battery from an external power supply may possibly decrease. Thus, in the apparatus of KOKAI No. H10-295046, it is difficult to correctly detect the presence/absence of deterioration of the battery.

Therefore, it is necessary to realize a novel function for correctly detecting the degradation of the battery.

BRIEF DESCRIPTION OF THE DRAWINGS

FIG. 1 is an exemplary perspective view showing the external appearance of an information processing apparatus according to an embodiment;

FIG. 5 is an exemplary view for explaining an example of a battery accumulated capacity reference value which is used in the battery error detection process illustrated in FIG. 4.

DETAILED DESCRIPTION

Figure 2:
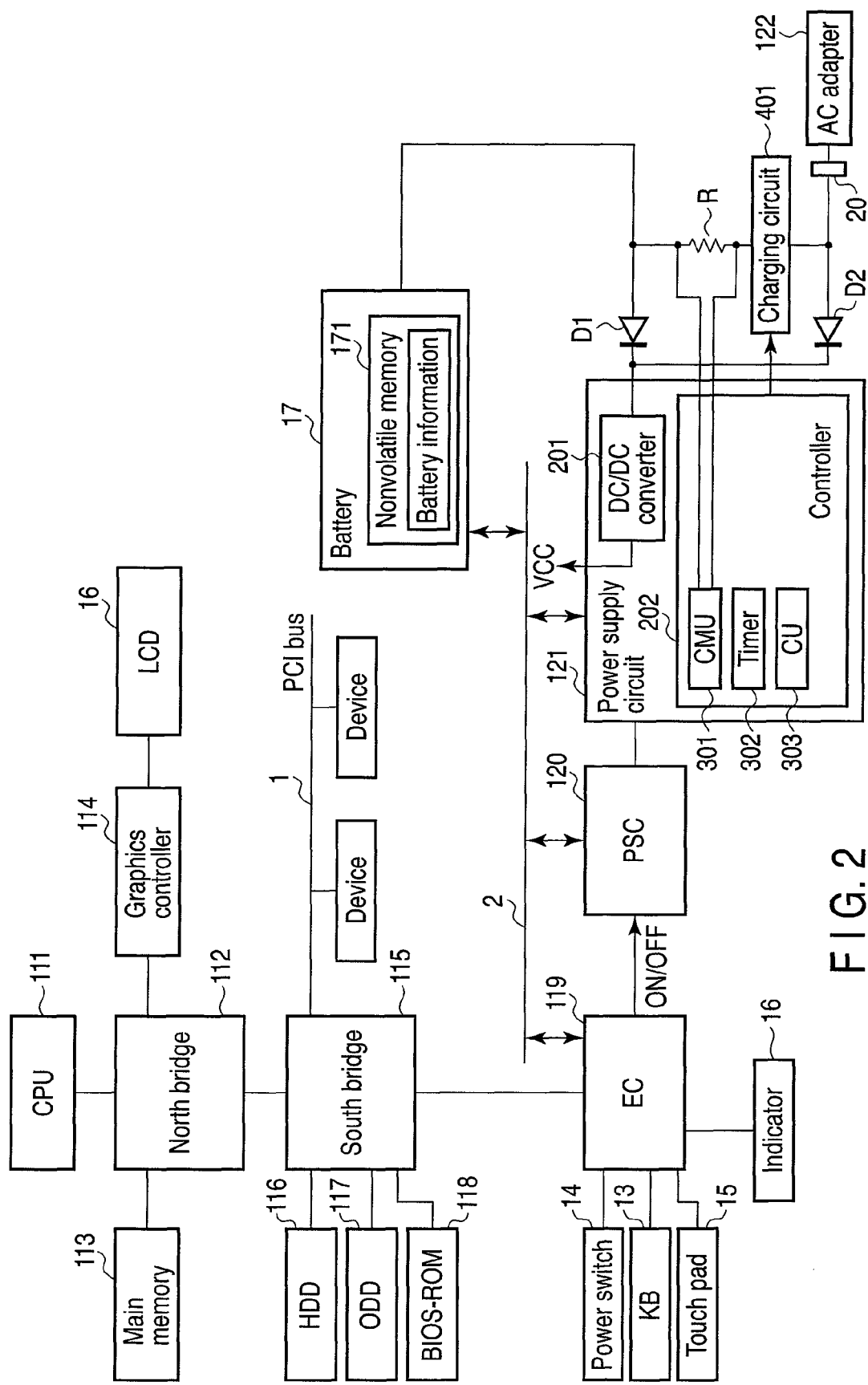
FIG. 2 is an exemplary block diagram showing an example of the system configuration of the information processing apparatus according to the embodiment.

In general, according to one embodiment, there is provided an information processing apparatus configured to be powered by a battery, comprising: a charging circuit configured to charge the battery by using power from an external power supply; a charging current measuring module configured to measure a charging current supplied to the battery from the charging circuit; a charging time measuring module configured to measure a time during which the battery is charged by the charging current; and a calculation module configured to calculate a charging capacity from the measured charging current and the measured charging time, and to compare an accumulated charging capacity, which is obtained by cumulatively adding the calculated charging capacity to a previously calculated charging capacity, with a reference value, in order to detect degradation of the battery.

To begin with, referring to FIG. 1, the structure of an information processing apparatus according to the embodiment is described. The information processing apparatus is realized, for example, as a notebook-type portable personal computer 10 which can be powered by a battery. FIG. 1 is a perspective view showing the computer 10, as viewed from the front side, in the state in which a display unit thereof is opened. The computer 10 comprises a computer main body 11 and a display unit 12. A display device that is composed of an LCD (Liquid Crystal Display) 16 is built in the display unit 12.

The display unit 12 is supported and attached to the computer main body 11 such that the display unit 12 is freely rotatable between an open position where a top surface of the computer main body 11 is exposed and a closed position where the top surface of the computer main body 11 is covered by the display unit 12. The computer main body 11 has a thin box-shaped housing. A keyboard 13, a power button 14 for powering on/off the computer 10, and a touch pad 15 are disposed on the top surface of the computer main body 11.

A power connector 20 is provided on the computer main body 11. The power connector 20 is provided on a side surface, for instance, a left side surface, of the computer main body 11. An external power supply device is detachably connected to the power connector 20. An AC adapter is usable as the external power supply device. The AC adapter is a power supply device which converts commercial power (AC power) to DC power.

The power connector 20 is composed of a jack. A power plug which is led out from the external power supply device such as an AC adapter, can detachably be connected to the jack. A battery 17 is provided in the computer main body 11. The battery 17 is detachably mounted, for example, on a rear end part of the computer main body 11.

The computer 10 is driven by power from the external power supply device or power from the battery 17. If the external power supply device is connected to the power connector 20 of the computer 10, the computer 10 is driven by power from the external power supply device. The power from the external power supply device is also used in order to charge the battery 17. The charging of the battery 17 is executed not only during the time period in which the computer 10 is powered on, but also during the time period in which the computer 10 is powered off. While the external power supply device is not connected to the power connector 20 of the computer 10, the computer 10 is driven by power from the battery 17.

The computer main body 11 is provided with an indicator 16 for indicating the degradation of the battery (battery error). The indicator 16 is provided, for example, on the front side of the computer main body 11. The indicator 16 may be composed of an LED. The battery error indicates that the residual life of the battery 17 is short, that is, the battery 17 has degraded. In the present embodiment, the presence/absence of degradation of the battery 17 is determined on the basis of the degree of decrease of the chargeable capacity of the battery 17. For example, if the ratio of the present chargeable capacity of the battery 17 to the rating capacity of the battery 17 has become lower than a reference ratio, it is detected that the battery 17 has degraded and the residual life of the battery 17 has decreased.

The chargeable capacity of the battery 17 (also referred to simply as battery capacity) decreases each time the battery 17 is charged. In other words, in accordance with the increase in charging capacity of the battery 17, the chargeable capacity of the battery 17 decreases. In the present embodiment, the charging capacity of the battery 17 is actually measured while the battery 17 is being charged. The charging capacity corresponds to the amount of increase of the capacity of the battery 17 by charging. In order to detect the degradation (decrease in chargeable capacity) of the battery 17, the accumulated value of charging capacity ("accumulated charging capacity") during the period from the shipment of the computer 10 (specifically, the time of start of use of the battery 17) to the present time is compared with a preset reference value. If the accumulated charging capacity exceeds the reference value, it is detected that the battery 17 has degraded, that is, the ratio of the chargeable capacity of the battery 17 to the rating capacity of the battery 17 has become lower than a predetermined reference ratio. Then, the occurrence of the battery error is indicated to the user by, e.g. turn-on/flicker of the indicator 16.

As has been described above, the degradation of the battery 17 can precisely be detected by evaluating the degree of decrease of the chargeable capacity of the battery 17 by using the accumulated charging capacity which is obtained by cumulatively adding the actually measured charging capacity, and not by using the number of times of full-charging of the battery 17.

FIG. 2 shows the system configuration of the computer 10. The computer 10 comprises a CPU 111, a north bridge 112, a main memory 113, a graphics controller 114, a south bridge 115, a hard disk drive (HDD) 116, an optical disc drive (ODD) 117, a BIOS-ROM 118, an embedded controller (EC) 119, a power supply controller (PSC) 120, a power supply circuit 121 and an AC adapter 122. The AC adapter 122 is used as the above-described external power supply device.

The CPU 111 is a processor which controls the operation of the components of the computer 10. The CPU 111 executes various software programs which are loaded from the HDD 116 into the main memory 113, for instance, an operating system (OS) and various application programs. The CPU 111 also executes a BIOS (Basic Input/Output System) which is stored in the BIOS-ROM 118 which is a nonvolatile memory. The BIOS is a system program for hardware control.

The north bridge 112 is a bridge device which connects a local bus of the CPU 111 and the south bridge 115. The north bridge 112 has a function of executing communication with the graphics controller 114. Further, the north bridge 112 includes a memory controller which controls the main memory 113. The graphics controller 114 is a display controller for controlling the LCD 16 that is used as a display monitor of the computer 10.

The south bridge 115 is connected to a PCI bus 1, and executes communication with each of devices on the PCI bus 1. The south bridge includes an IDE (Integrated Drive Electronics) controller and a serial ATA controller for controlling the hard disk drive (HDD) 116 and optical disc drive (ODD) 117.

The embedded controller (EC) 119, power supply controller (PSC) 120, power supply circuit 121 and battery 17 are interconnected via a serial bus 2 such as an $I^2C$ bus or an LPC (low pin count) bus. The embedded controller (EC) 119 is a power management controller for executing power management of the computer 10, and is realized, for example, as a 1-chip microcomputer which incorporates a keyboard controller for controlling the keyboard (KB) 13 and touch pad 15. The EC 119 has a function of powering on/off the computer 10 in response to the user's operation of the power switch 14. The power-on/off control of the computer 10 is executed by the cooperation between the EC 119 and the power supply controller (PSC) 120. Upon receiving an ON signal which is sent from the EC 119, the power supply controller (PSC) 120 controls the power supply circuit 121, thus powering on the computer 10. On the other hand, upon receiving an OFF signal which is sent from the EC 119, the power supply controller (PSC) 120 controls the power supply circuit 121, thus powering off the computer 10. The EC 119, power supply controller (PSC) 120 and power supply circuit 121 operate by power from the battery 17 or AC adapter 122, even while the computer 10 is in the power-off state.

The power supply circuit 121 generates operation power to each component by using power from the battery 17 which is mounted in the computer main body 11, or power from the AC adapter 122 which is connected to the computer main body 11 as the external power supply. In the case where the AC adapter 122 is connected to the computer main body 11, the power supply circuit 121 generates operation power to each component by using power from the AC adapter 122, and charges the battery 17 by powering on a charging circuit 401. The battery 17 is connected to a power input terminal of the power supply circuit 121 via a diode D1, and the AC adapter 112 is also connected to the power input terminal of the power supply circuit 121 via a diode D2. The charging circuit 401 is connected, for example, between the anode of the diode D2 and the anode of the diode D1. Under the control of the power supply circuit 121, the charging circuit 401 charges the battery 17 by using power from the AC adapter 112. The charging circuit 401 includes, for example, a switch circuit which is turned on/off by a control signal from the power supply circuit 121. In the case where the AC adapter 122 is connected to the computer main body 11, the charging of the battery 17 is executed until the capacity of the battery 17 reaches a predetermined reference capacity.

The power supply circuit 121 includes a DC/DC converter 201 and a controller 202. The DC/DC converter 201 generates power VCC of a target DC voltage as operation power, by converting an input DC voltage, which is input to the power input terminal, to the target DC voltage. The controller 202 controls the charging circuit 401. The controller 202 includes a current measuring unit (CMU) 301 and a timer 302 in order to measure a charging current and a charging time for the battery 17. The current measuring unit (CMU) 301 measures a charging current X which is supplied from the charging circuit 401 to the battery 17. The charging current X can be measured, for example, by monitoring the voltage across both ends of a resistor R which is connected between the output of the charging circuit 401 and the battery 17. The timer 302 measures the time (charging time Y) during which the battery 17 is charged by the charging current. The charging time Y is the time during which the charging current X is supplied to the battery 17. If the AC adapter 112 is removed, the charging of the battery 17 is ended at this time point.

The controller 202 further includes a calculation unit (CU) 303. The calculation unit (CU) 303 calculates a charging capacity Z1 from the charging current X and charging time Y. In order to detect degradation of the battery 17, the calculation unit (CU) 303 compares an accumulated charging capacity Z2 (=Σ Z1), which is obtained by cumulatively adding the calculated charging capacity Z1 to the previously calculated charging capacity Z1, with a predetermined reference value Z3. If the accumulated charging capacity Z2 (=Σ Z1) exceeds the reference value Z3, the calculation unit (CU) 303 cooperates with the EC 119 and outputs an alarm output from the indicator 16, thereby to indicate the degradation of the battery.

As described above, the EC 119, power supply controller (PSC) 120 and power supply circuit 121 operate even while the computer 10 is in the power-off state. Thus, the process for detecting the battery error (the charging current measuring process, charging time measuring process, charging capacity calculation process, accumulated charging capacity calculation process, process of comparison between the accumulated charging capacity and reference value, and process of indicating the occurrence of the battery error) can be executed at all times.

The battery 17 comprises a plurality of secondary cells and a nonvolatile memory 171. The nonvolatile memory 171 comprises, e.g. an EEPROM. The nonvolatile memory 171 is used for storing battery information which is indicative of the capability and state of the battery 17. Characteristic information of the battery 17 is an example of the battery information. The characteristic information is stored in advance in the nonvolatile memory 171. The characteristic information includes, for example, a rating capacity B [mAh] of the battery 17 and a decrement parameter A [%] of the battery 17. The decrement parameter A [%] is a parameter which is indicative of the chargeable capacity decrease rate of the battery 17. The decrement parameter A [%] is indicative of, for example, the ratio of the chargeable capacity, which is decreased in relation to the full-charging of a predetermined number of times (e.g. 100 times). For example, A=5 [%] means that the chargeable capacity decreases by 5% each time the full-charging is executed 100 times. As the above-described reference value Z3, use may be made of the accumulated capacity reference value which can be calculated on the basis of the battery characteristic information. The accumulated capacity reference value is indicative of the total charging capacity, up to which the battery 17 can be charged until the ratio of the chargeable capacity of the battery 17 to the rating capacity B of the battery 17 decreases to a predetermined ratio. An example of calculation of the accumulated capacity reference value will be described later with reference to FIG. 5.

Figure 3:
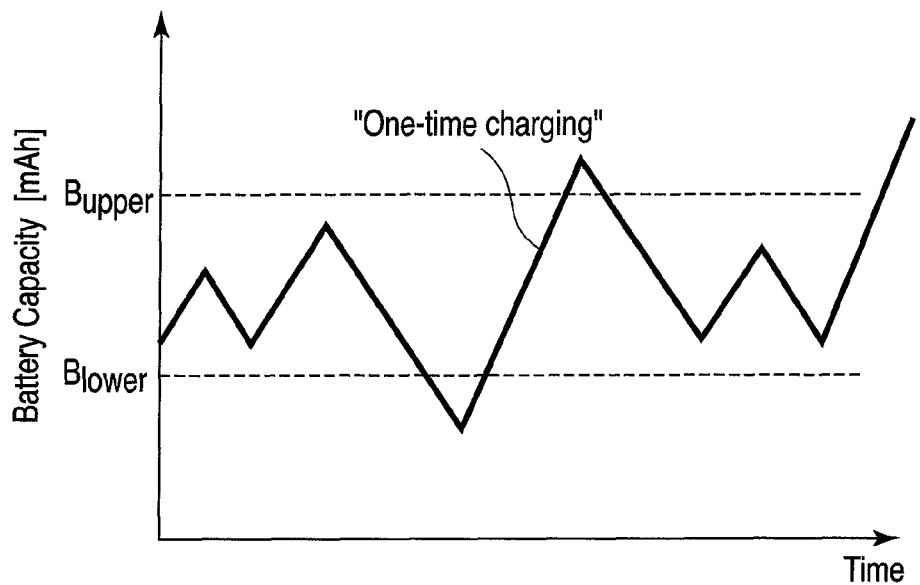
FIG. 3 is an exemplary view for explaining the relationship between the variation in charging capacity of a battery and the counted number of times of charging.

FIG. 3 shows the relationship between the variation in charging capacity of a battery and the counted number of times of charging. In the prior art, in many cases, the decrease in chargeable capacity has been determined on the basis of the number of times of full-charging. In this case, "one-time charging" is counted when the battery capacity has increased from a lower limit value (B_lower) to an upper limit value (B_upper) at a time by charging. Thus, if charging is performed such that the battery capacity varies within the range between the lower limit value (B_lower) and the upper limit value (B_upper), such charging is not counted as the number of times of charging.

In the present embodiment, the accumulated charging capacity (Σ Z1), which is obtained by cumulatively adding the actually measured charging capacities Z1s, is used in place of the number of times of full-charging. On the basis of the accumulated charging capacity, the decrease in chargeable capacity is determined. Thus, the presence/absence of the decrease in chargeable capacity can precisely be determined in the state in which consideration is also given to such charging that the battery capacity varies within the range between the lower limit value (B_lower) and the upper limit value (B_upper).

Figure 4:
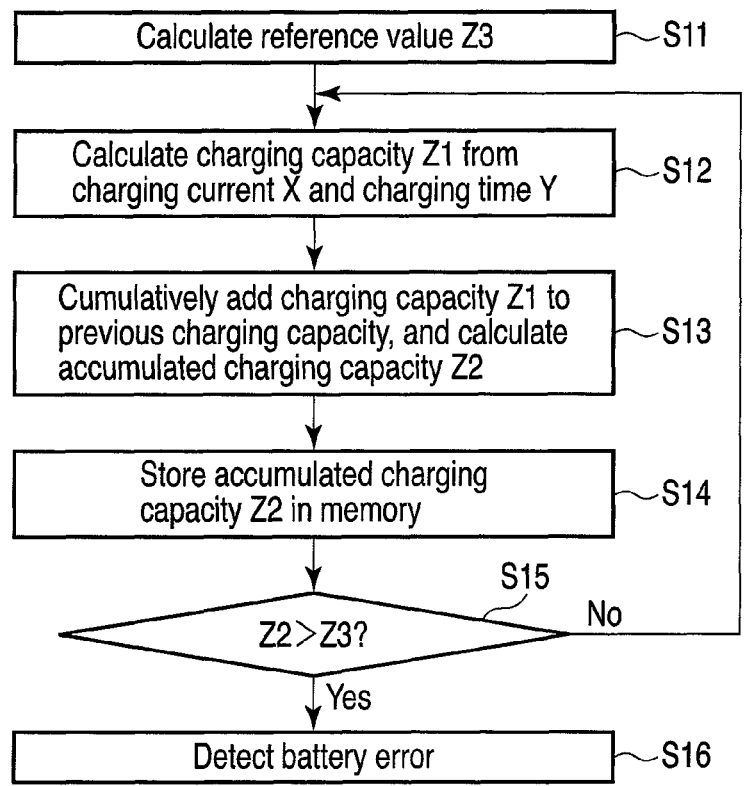
FIG. 4 is an exemplary flow chart illustrating an example of the procedure of a battery error detection process which is executed by the information processing apparatus according to the embodiment.

Next, referring to a flow chart of FIG. 4, a description is given of the procedure of the battery error detection process which is executed by the computer 10.

(1) Calculation of Reference Value Z3

To start with, the controller 202 of the power supply circuit 121 calculates the above-described reference value Z3 (step S11). The accumulated capacity reference value can be used as the reference value Z3. The accumulated capacity reference value corresponds to an area of a hatched part in FIG. 5. FIG. 5 shows the relationship between the number of times of full-charging and the battery capacity. In FIG. 5, it is assumed that the chargeable capacity of the battery 17 linearly decreases in proportion to the increase in the number of times of full-charging. The area of the hatched part in FIG. 5 indicates the total charging capacity which is chargeable until the ratio of the chargeable capacity of the battery 17 to the rating capacity B of the battery 17 decreases to a predetermined ratio α % (e.g. 50%). A case is assumed in which the decrement parameter A=5 [%] and the rating capacity B=5000 [mAh]. In this case, the number N of times of full-charging, at which the ratio of the chargeable capacity to the rating capacity B decreases to the predetermined ratio (e.g. 50%), is given by:

$$N(\text{counts}) = 50\% / A(\%/\text{counts})$$
$$N = 50\% / (5\%/100 \text{ counts})$$
$$= 1000 (\text{counts}).$$

The area (=Z3) of the hatched part in FIG. 5 is given by:

$$= B \times N - (B \times N \times 50/100) \times 1/2$$
$$= 0.75 \times B \times N$$
$$= 0.75 \times 5000 \times 1000$$
$$= 3,750,000 \ [mAh].$$

In this manner, the accumulated capacity reference value Z3 can be calculated on the basis of the battery characteristic information (rating capacity B [mAh] and decrement parameter A [%]) stored in the nonvolatile memory 171 in the battery 17. Depending on the types of batteries, there may be a case in which the chargeable capacity decrease rate is equal in all batteries. In this case, without reading the decrement parameter from the nonvolatile memory 171, a predetermined chargeable capacity decrease rate may be used for the calculation of the accumulated capacity reference value Z3.

(2) Calculation of Charging Capacity Z1

The controller 202 of the power supply circuit 121 charges the battery 17 by controlling the charging circuit 401. While the battery 17 is being charged, the current measuring unit (CMU) 301 measures the charging current X which is supplied from the charging circuit 401 to the battery 17, and the timer 302 measures the charging time X of the battery 17. The controller 202 calculates the charging capacity Z1 from the charging current X and charging time Y (step S12). The charging capacity Z1 is given by:

$$Z1=X \times Y.$$

If the charging current X varies from X1 to X2 during a certain single-time charging period, the charging capacity Z1 in this charging period can be calculated by:

$$Z1=X1 \times Y1 + X2 \times Y2$$

where Y1 is the time of charging with the charging current X1, and Y2 is the time of charging with the charging current X2.

(3) Calculation of. Accumulated Charging Capacity Z2

The controller 202 of the power supply circuit 121 calculates the accumulated charging capacity Z2 by cumulatively adding the charging capacity Z1, which has been calculated in step S12, to the previously calculated charging capacity (step S13). The accumulated charging capacity Z2 is the cumulative value of the charging capacities of charging operations which have been executed up to the present, and is given by:

$$Z2=\Sigma Z1.$$

(4) Storing of Accumulated Charging Capacity Z2

The controller 202 of the power supply circuit 121 stores the calculated accumulated charging capacity Z2 in the nonvolatile memory (step S14). In step S14, the calculated accumulated charging capacity Z2 is stored, for example, in the nonvolatile memory 171 in the battery 17. Thus, in the above-described step S13, the present accumulated charging capacity Z2 can be calculated by adding the charging capacity Z1, which has been calculated in step S12, to the accumulated charging capacity Z2 which has been read from the nonvolatile memory 171.

(5) Comparison Between Accumulated Charging Capacity Z2 and Accumulated Capacity Reference Value Z3

The controller 202 of the power supply circuit 121 compares the accumulated charging capacity Z2 with the accumulated capacity reference value Z3, and determines whether the accumulated charging capacity Z2 has exceeded the accumulated capacity reference value Z3 (step S15). If the accumulated charging capacity Z2 is greater than the accumulated capacity reference value Z3, the controller 202 detects an error of the battery 171 (a decrease in chargeable capacity), and outputs an warning signal for turning on the indicator 16 (step S16). In step S16, it may be possible to display on the screen of the LCD 16 a warning message indicating that the chargeable capacity of the battery 171 has decreased. Besides, a predetermined warning sound may be output.

As has been described above, in the present embodiment, the accumulated charging capacity, which is obtained by cumulatively adding the actually measured charging capacities, is compared with the reference value, and thereby the decrease in chargeable capacity of the battery, that is, the degradation of the battery, is detected. Thus, the degradation of the battery can exactly be detected without being influenced by the variation of the charging current due to a load change. In addition, since consideration can be given to such charging that the battery capacity varies within the range between the lower limit value (B_lower) and the upper limit value (B_upper), the degree of degradation of the battery can be determined more precisely than in the case of determining the degree of degradation of the battery by using the number of times of full-charging.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing apparatus configured to be powered by a battery, comprising:
   a charging circuit configured to charge the battery with power from an external power supply;
   a charging current measuring module configured to measure a charging current from the charging circuit to the battery;
   a charging time measuring module configured to measure a time during which the battery is charged by the charging current; and
   a calculation module configured to calculate a charging capacity from the measured charging current and the measured charging time, to calculate an accumulated capacity reference value indicative of a total chargeable capacity of the battery, which is chargeable until a ratio of a chargeable capacity of the battery to a rating capacity of the battery decreases to a predetermined ratio, based on characteristic information of the battery, and to compare an accumulated charging capacity, which is obtained by cumulatively adding the calculated charging capacity to a previously calculated charging capacity, with the accumulated capacity reference value, in order to detect degradation of the battery, wherein the characteristic information is indicative of the rating capacity of the battery and a chargeable capacity decrease rate of the battery, and wherein the chargeable capacity decrease rate is indicative of a ratio of the chargeable capacity which is decreased when full-charging of the battery is executed a predetermined number of times.

2. The information processing apparatus of claim 1, wherein the characteristic information of the battery is stored in a nonvolatile memory in the battery.

3. The information processing apparatus of claim 1, wherein the calculation module is configured to store the accumulated charging capacity in a nonvolatile memory in the battery.

4. The information processing apparatus of claim 1, further comprising an indicator configured to indicate degradation of the battery if the accumulated charging capacity exceeds the accumulated capacity reference value.

5. A method of detecting degradation of a battery configured to be attached to an information processing apparatus, comprising:
  measuring a charging current from a charging circuit to the battery, the charging circuit being configured to charge the battery by using power from an external power supply;
  measuring a time during which the battery is charged by the charging current;
  calculating a charging capacity from the measured charging current and the measured charging time;
  calculating an accumulated capacity reference value indicative of a total chargeable capacity of the battery, which is chargeable until a ratio of a chargeable capacity of the battery to a rating capacity of the battery decreases to a predetermined ratio, based on characteristic information of the battery, wherein the characteristic information is indicative of the rating capacity of the battery and a chargeable capacity decrease rate of the battery, and wherein the chargeable capacity decrease rate is indicative of a ratio of the chargeable capacity which is decreased when full-charging of the battery is executed a predetermined number of times; and
  comparing an accumulated charging capacity, which is obtained by cumulatively adding the calculated charging capacity to a previously calculated charging capacity, with the accumulated capacity reference value, in order to detect degradation of the battery.

6. The method of claim 5, wherein the characteristic information of the battery is stored in a nonvolatile memory in the battery.

7. The method of claim 5, further comprising producing a warning output to indicate degradation of the battery if the accumulated charging capacity exceeds the reference value.

\* \* \* \* \*